United States Patent
Nagatomi et al.

(10) Patent No.: US 7,525,897 B2
(45) Date of Patent: Apr. 28, 2009

(54) OPTICAL PICKUP DEVICE

(75) Inventors: Kenji Nagatomi, Gifu (JP); Seiji Kajiyama, Gifu (JP)

(73) Assignee: Sanyo Electric Co., Ltd., Osaka (JP)

( * ) Notice: Subject to any disclaimer, the term of this patent is extended or adjusted under 35 U.S.C. 154(b) by 599 days.

(21) Appl. No.: 11/290,505

(22) Filed: Dec. 1, 2005

(65) Prior Publication Data

US 2006/0126673 A1    Jun. 15, 2006

(30) Foreign Application Priority Data

Dec. 15, 2004    (JP)    ............................. 2004-363735

(51) Int. Cl.
*G11B 7/00* (2006.01)
(52) U.S. Cl. ................. 369/112.01; 369/121; 369/44.37
(58) Field of Classification Search ........................ None
See application file for complete search history.

(56) References Cited

U.S. PATENT DOCUMENTS 5,493,554 A    2/1996    Sasaki et al.
7,369,481 B2 *  5/2008    Kimura et al. ......... 369/112.23

FOREIGN PATENT DOCUMENTS

| JP | 06-131688 | 5/1994 |
| JP | 11-134702 | 5/1999 |
| JP | 2001-043559 | 2/2001 |
| JP | 2001-143297 | 5/2001 |
| JP | 2002-237081 | 8/2002 |
| JP | 2003-085811 | 3/2003 |
| JP | 2004-103145 | 4/2004 |

OTHER PUBLICATIONS

First Chinese Office Action with written opinion issued in Chinese Patent Application No. 200510125461.2 dated on Jun. 8, 2007.
Japanese Office Action, with English translation, issued in Japanese Patent Application No. JP 2004-363735, mailed Sep. 2, 2008.

* cited by examiner

*Primary Examiner*—Muhammad N. Edun
(74) *Attorney, Agent, or Firm*—McDermott Will & Emery LLP

(57) ABSTRACT

Provided is an optical pickup device in which the deterioration of optical characteristics of a laser light beam due to a deviation of an optical axis can be smoothly suppressed with a simple structure. An objective lens becomes a finite system for only a laser light beam for CD (780 nm in wavelength). A three-wavelength laser is disposed such that an optical axis of the laser light beam for CD is aligned with an optical axis of an optical system including a polarization BS to an optical axis correcting element. In this case, the large deterioration of the optical properties of the laser light beam for CD, which cannot be sufficiently compensated even if the objective lens is tilted, does not occur. A stable recording and reproducing operation using the laser light beam for CD can be performed. At this time, although an optical axis of a laser light beam for DVD and an optical axis of a laser light beam for next-generation DVD are deviated from an optical axis of the optical system, the laser light beams are incident on the objective lens as infinite system light beams, so the deterioration of the optical properties due to the deviation can be suppressed by tilting the objective lens.

12 Claims, 13 Drawing Sheets

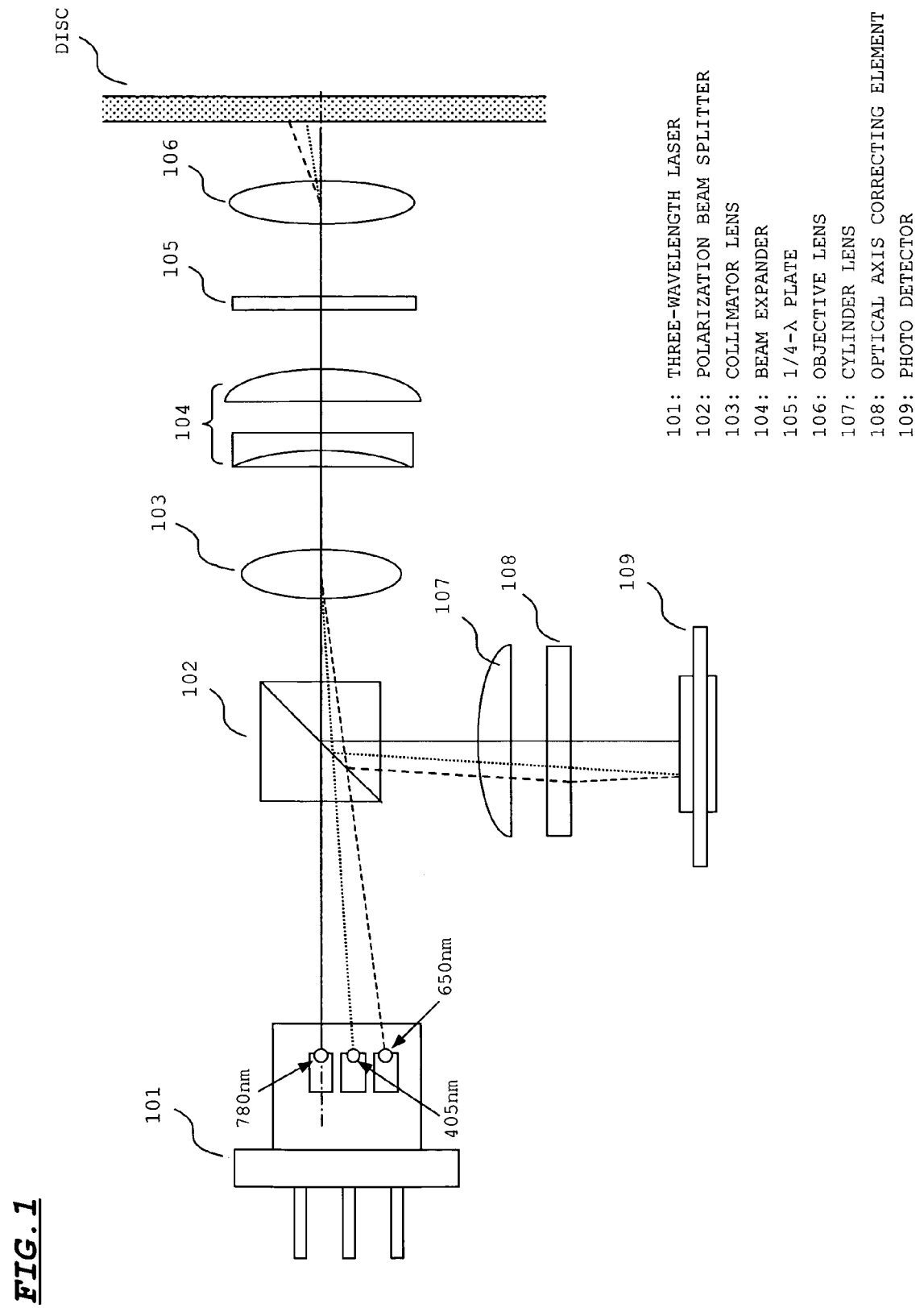

WHEN LASER LIGHT EMISSION

WHEN LASER LIGHT RECEPTION

DIFFRACTION ORDER AND DIFFRACTION EFFICIENCY

|  | 405nm | 650nm | 780nm |
|---|---|---|---|
| DIFFRACTION ORDER | 0 | +1 | 0 |
| DIFFRACTION EFFICIENCY | 96 | 80 | 98 |

DESIGN VALUES OF OPTICAL AXIS CORRECTING ELEMENT (1) STEP HEIGHT H = 1.57 μm
(2) REFRACTION INDEX
    WAVELENGTH 405 nm: n = 1.53
    WAVELENGTH 650 nm: n = 1.52
    WAVELENGTH 780 nm: n = 1.51

FOUR-STEP GRATING PATTERN

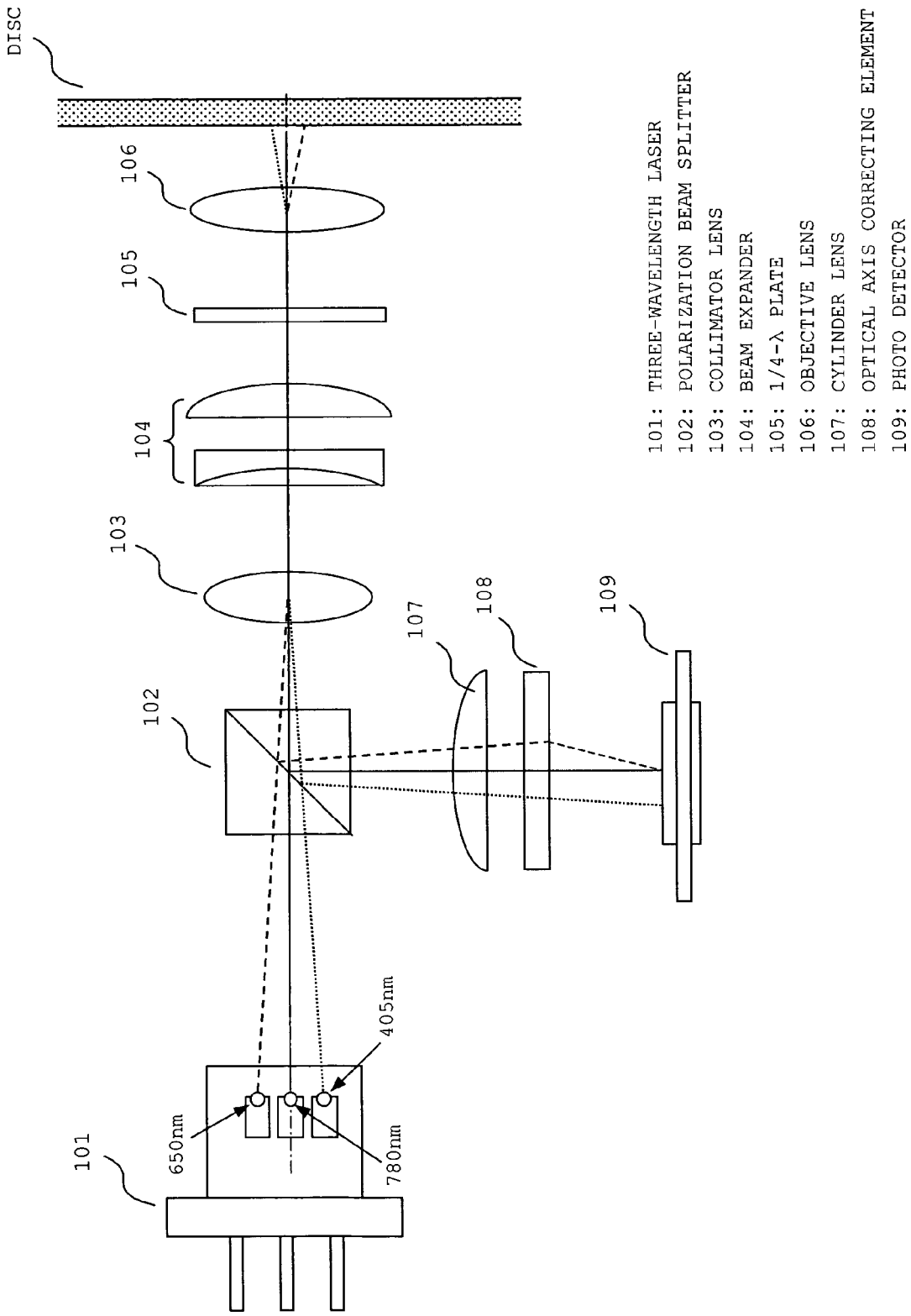

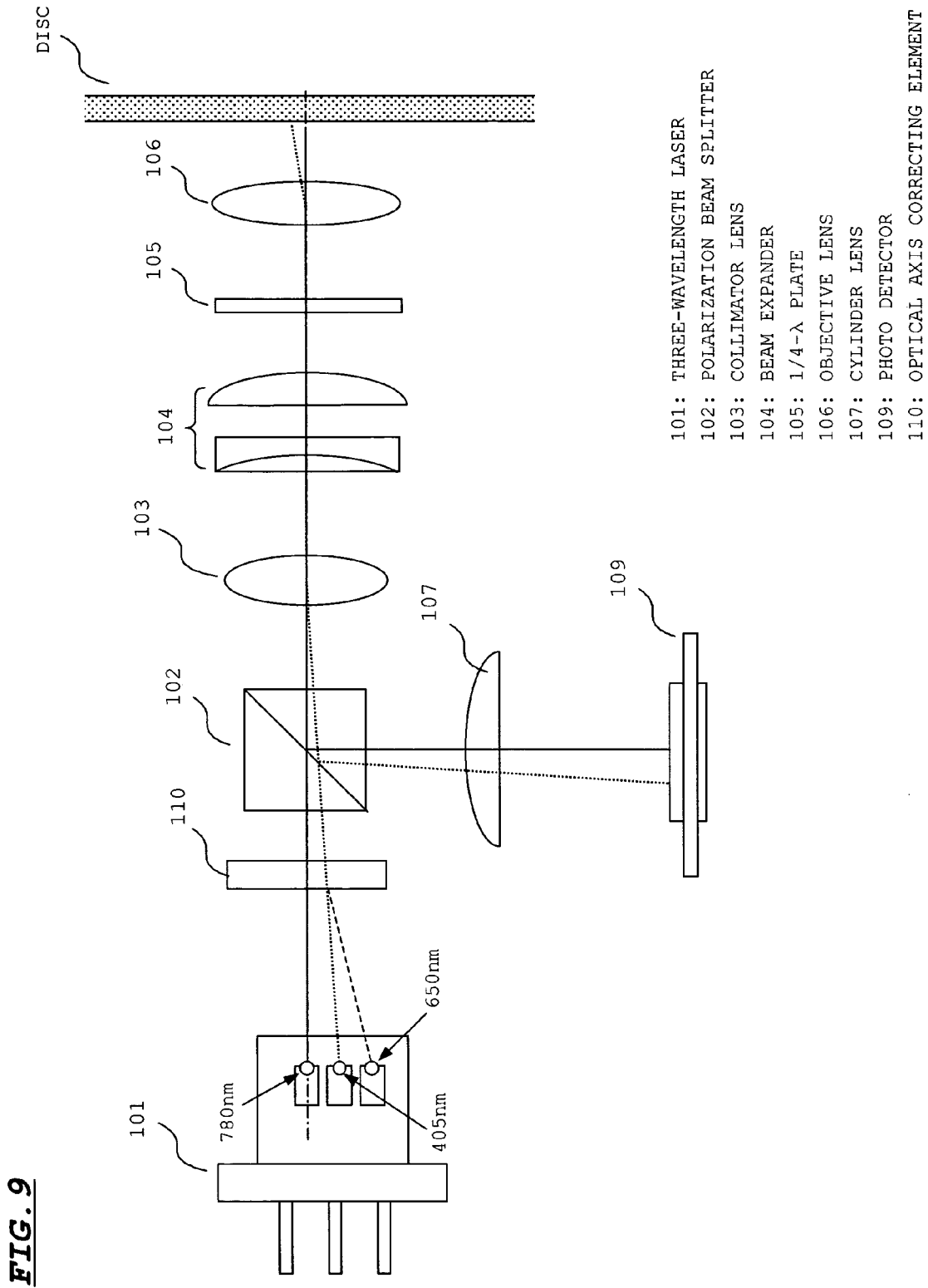

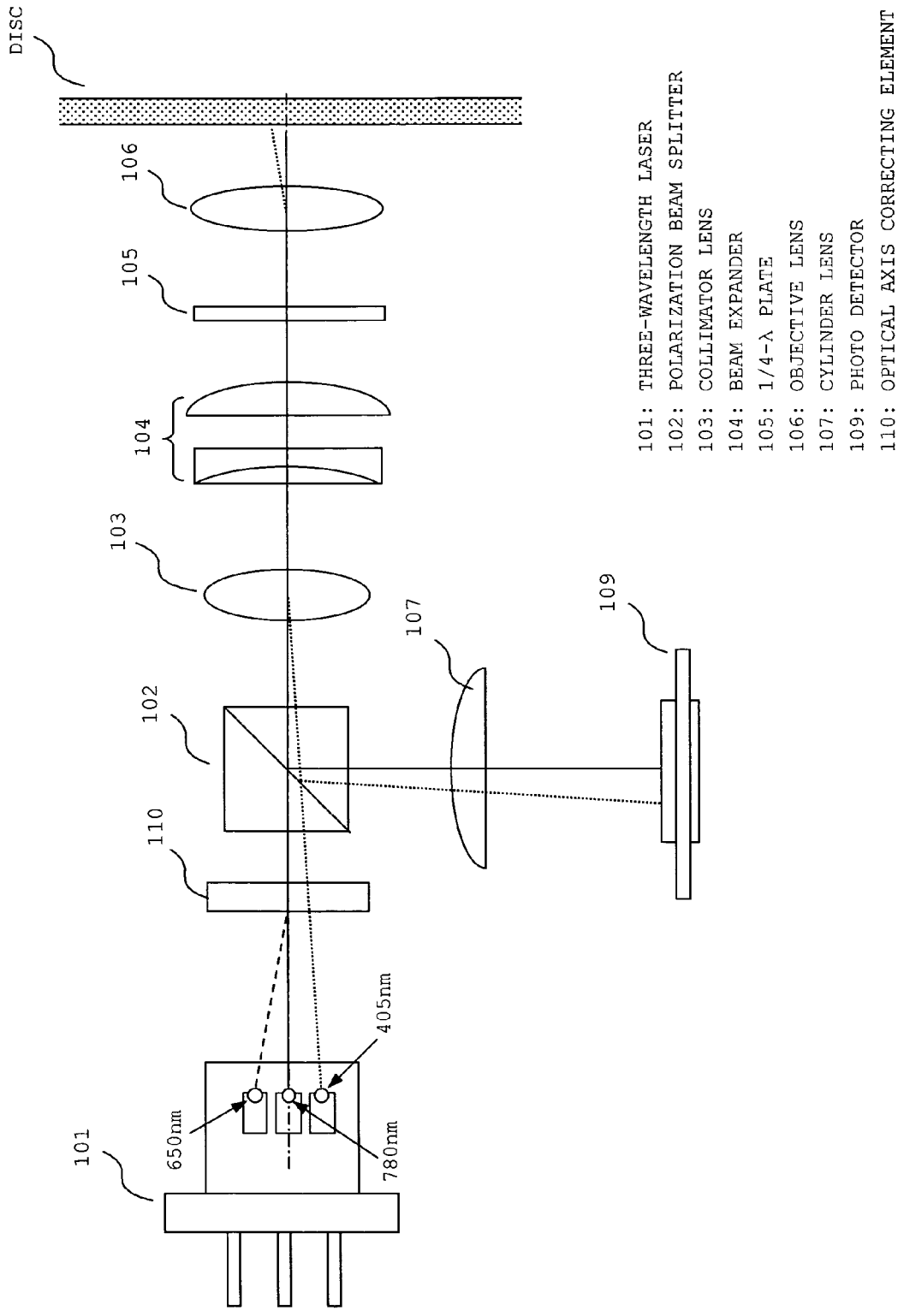

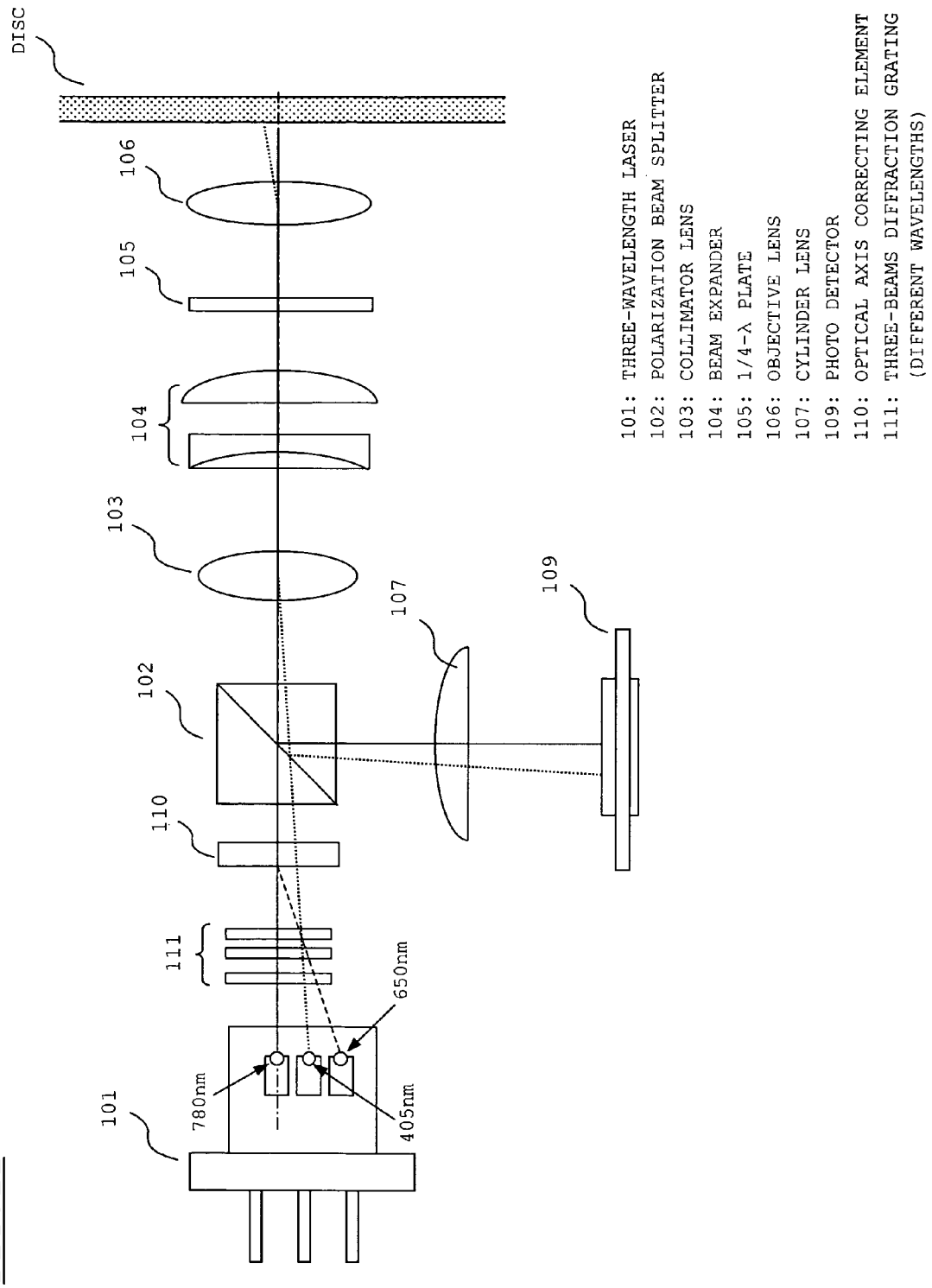

LASER ELEMENT ARRANGEMENT VIEWED FROM SIDE OF SEMICONDUCTOR LASER

LASER ELEMENT ARRANGEMENT VIEWED FROM SIDE OF LASER EMISSION POINT

OPTICAL PICKUP DEVICE

BACKGROUND OF THE INVENTION

1. Field of the Invention

The present invention relates to an optical pickup device, and more particularly to an optical pickup device suitable for a compatible optical pickup device for emitting several laser light beams having different wavelengths to a recording medium.

2. Description of the Related Art

Currently, various optical discs such as a compact disc (CD) and a digital versatile disc (DVD) have been commercialized and widely used. Further, recently, standardization of a next-generation DVD for recording and reproducing information using a blue-violet laser light beam has been proceeded. In the next-generation DVD, information is recorded and reproduced using the blue-violet laser light beam having a wavelength of about 405 nm. When the wavelength of the laser light beam shortens, a higher density can be obtained.

Therefore, when the variety of optical discs increases, development of a so-called compatible optical pickup device capable of performing recording and reproduction on different kinds of optical discs is demanded. In this case, an arrangement in which a plurality of laser elements having different emitting wavelengths are provided all together in a single CAN package can be achieved. According to such arrangement, a space for disposing semiconductor lasers can be reduced and an optical system can be commonly used among the laser light beams.

However, when the plurality of laser elements are provided in the single CAN package as described above, a deviation occurs between the optical axes of the laser light beams according to arrangement gap between the respective laser elements. Thus, when the optical axis of the optical system is aligned with the optical axis of a laser light beam, the optical axes of other laser light beams deviate from the optical axis of the optical system. Consequently, in the case of recording and reproduction using the other laser light beams, there arises a problem in that aberration of laser light beams is produced on a recording medium to cause deterioration of optical characteristics.

Therefore, according to the related invention as disclosed in JP 06-131688 A, a birefringence element is disposed immediately after a semiconductor laser including several kinds of laser elements, and the optical axes of the laser light beams are aligned with one another by the birefringence element to guide the laser light beams to the optical system.

The related invention requires an additional birefringence element. In addition, it is necessary to form the respective laser elements such that the polarization plane of a reference laser light beam is orthogonal to the polarization plane of another other laser light beam. However, it is not easy to form the laser elements in which the polarization planes of the laser light beams are different from each other. Because the birefringence element is expensive, a problem in that a cost of the entire optical pickup device increases occurs.

Therefore, Japanese Patent Application No. 2004-145169 has been filed by the applicant of the present invention to propose an optical axis correcting technique using a diffraction grating. According to this related invention, the diffraction grating is used as an optical axis correcting element, so an increase in cost can be suppressed. In addition, it is unnecessary to adjust the process to form laser elements while considering the state of the polarization plane of each laser beams having different kinds of wavelength, unlike JP 06-131688 A.

As described above, when the three laser elements for emitting a laser light beam for CD, a laser light beam for DVD, and a laser light beam for next-generation DVD are housed in the same CAN package, the optical axis of the laser light beam for next-generation DVD is normally aligned with the optical axis of the optical system in priority to the other laser light beams. This is because the wavelength of the laser light beam for next-generation DVD is short and the emitting power thereof is weak.

In contrast to this, there is a case where an objective lens is designed so as to become a finite system for only the laser light beam for CD, of the three laser light beams. In such a case, when the optical axis of the laser light beam for CD is deviated from the optical axis of the objective lens, optical properties of the laser light beam for CD significantly deteriorates as compared with a case where the other laser light beam is deviated therefrom.

In order to suppress the deterioration of optical properties by the off-axis, a method of tilting the objective lens has been known. However, when the laser light beam is incident on the objective lens as a finite system light beam as in the case of the laser light beam for CD, the deterioration of the optical properties due to the deviation of the optical axis becomes significant. According to the study of the inventor of the present invention, when the laser light beam is incident on the objective lens as the finite system light beam as in the case of the laser light beam for CD, it is determined that the deterioration of the optical properties cannot be sufficiently compensated even if the tilting is performed. In contrast to this, when the laser light beam is incident on the objective lens as an infinite system light beam, the deterioration of the optical properties can be compensated by the tilting.

SUMMARY OF THE INVENTION

An object of the present invention is to provide an optical pickup device in which the deterioration of optical properties of a laser light beam can be smoothly suppressed with a simple structure in accordance with the result of the study.

According to an aspect of the present invention, there is provided an optical pickup device including a semiconductor laser having three light emitting elements (laser elements) for emitting laser light beams having different wavelengths, which are housed in a case, and an optical system for guiding the laser light beams emitted from the semiconductor laser onto a recording medium, in which an optical axis of a laser light beam which is incident on the objective lens as a finite system light beam, of the laser light beams emitted from the three light emitting elements is aligned with an optical axis of the optical system.

According to the optical pickup device in this aspect, the optical axis of the laser light beam which is incident on the objective lens as the finite system light beam is aligned with the optical axis of the optical system, so the large deterioration of the laser light beam, which cannot be sufficiently compensated even if the objective lens is tilted, does not occur as described above. Therefore, stable recording and reproducing characteristics can be realized.

According to this aspect, when the objective lens becomes a finite system for only one laser light beam of the laser light beams emitted from the three light emitting elements, position of the semiconductor laser may be adjusted relative to the optical system to align the optical axis of the laser light beam which is incident on the objective lens as the infinite system laser beam with the optical axis of the optical system.

In such a case, it is only necessary to adjust the positions of the light emitting elements of the semiconductor laser, so it is possible to prevent the optical system from complicating. Therefore, the structure of the optical pickup device can be simplified.

Further, according to this aspect, the semiconductor lasers can be housed in the case so that a first light emitting element of the light emitting elements is prevented from interposing between a second light emitting element of the light emitting elements which emits the laser light beam which is incident on the objective lens as the finite system light beam and a third light emitting element of the light emitting elements in a direction orthogonal to the optical axis of the emitted laser light beam.

In such a case, the optical axes of the laser light beams other than the laser light beam which is incident on the objective lens as the finite system light beam can be made close to the optical axis of the optical system. Therefore, it is possible to suppress the deterioration of the optical properties of each of the laser light beams.

Further, the optical pickup device according to this aspect, can further include a diffraction grating for aligning an optical axis of only one of two laser light beams other than the laser light beam which is incident on the objective lens as the finite system light beam with one of an optical axis of the other of the two laser light beams and the optical axis of the laser light beam which is incident on the objective lens as the finite system light beam by a diffraction action.

In such a case, the optical properties of the laser light beam which is subjected to optical axis alignment by the diffraction grating can be improved, so that the characteristics of the optical pickup device can be stabilized. Only one of the two laser light beams other than the laser light beam which is incident on the objective lens as the finite system light beam is subjected to the optical axis alignment by the diffraction grating, so the power attenuation of each of the laser light beams based on the diffraction efficiency is caused only one time in a single diffraction grating. Therefore, the attenuation of each of the laser light beams having the wavelengths can be suppressed as compared with the case where the remaining two laser light beams are subjected to the optical axis alignment by the diffraction grating.

Note that the diffraction grating may be disposed on an optical path from the semiconductor laser to the objective lens or disposed on an optical path from the objective lens to the photo detector. In any case, it is possible to obtain an effect in which the photo detector can be commonly used. In addition to this, in the former, the laser light beam is guided to the objective lens after the optical axis alignment, so it is possible to obtain an effect in which the optical properties of the laser light beam can be improved.

In each of the aspects, when it is designed such that the semiconductor laser can emit a laser light beam for CD, a laser light beam for DVD, and a laser light beam for next-generation DVD and the objective lens becomes a finite system for the laser light beam for CD and becomes an infinite system for the other laser light beams, an optical axis of the laser light beam for CD can be aligned with the optical axis of the optical system to dispose the semiconductor laser relative to the optical system.

BRIEF DESCRIPTION OF THE DRAWINGS

The above-mentioned and other objects of the present invention and the novel features thereof will be completely more clear when the following descriptions of the embodiments are read with reference to the accompanying drawings:

FIG. 1 is a structural view showing an optical pickup device according to an embodiment of the present invention;

FIG. 8 is a structural view showing an optical pickup device according to another embodiment of the present invention;

FIG. 9 is a structural view showing an optical pickup device according to another embodiment of the present invention;

FIG. 10 is a structural view showing an optical pickup device according to another embodiment of the present invention;

FIG. 11 is a structural view showing an optical pickup device according to another embodiment of the present invention;

DESCRIPTION OF PREFERRED EMBODIMENTS

Figure 2B:
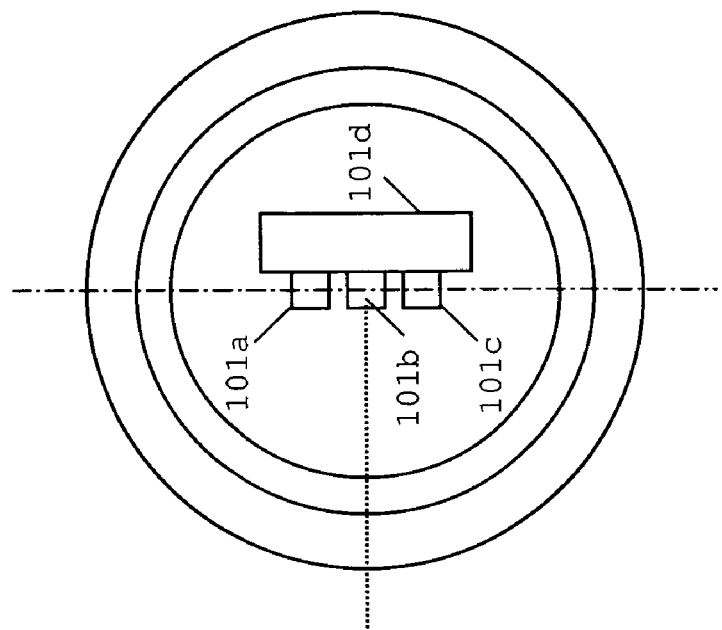
FIGS. 2A and 2B are structural views showing a three-wavelength laser in the embodiment of the present invention.

FIG. 1 shows a structure of an optical pickup device according to an embodiment of the present invention. The optical pickup device is used as a compatible pickup device for CD/DVD/next-generation DVD.

The optical pickup device according to this embodiment includes a three-wavelength laser 101, a polarization BS (beam splitter) 102, a collimator lens 103, a beam expander 104, a λ/4 plate 105, an objective lens 106, a cylinder lens 107, an optical axis correcting element 108, and a photo detector 109.

The three-wavelength laser 101 has three laser elements that emit a laser light beam for CD (780 nm in wavelength), a laser light beam for DVD (650 nm in wavelength), and a laser light beam for next-generation DVD (405 nm in wavelength), respectively, which are housed in the same CAN package. The respective laser elements are aligned on a straight line at predetermined gaps. Polarization planes of the laser light beams emitted from the respective laser elements are parallel to one another. Here, the three-wavelength laser 101 is arranged such that an optical axis of the laser light beam for CD aligns with an optical axis of an optical system composed of the polarization BS 102 to the objective lens 106, cylinder lens 107 and the optical axis correcting element 108.

The polarization BS 102 completely transmits the laser light beam emitted from the three-wavelength laser 101 and completely reflects the laser light beam from a disc 100.

The collimator lens 103 converts each of the incident laser light beams having the respective wavelengths from the polarization BS 102 into a parallel light beam. Here, the collimator lens 103 is formed by bonding a plurality of lenses whose Abbe numbers and curvatures (spherical surfaces) are adjusted such that an achromatic effect can be realized for each of the laser light beams having the respective wavelengths.

The beam expander 104 includes a concave lens, a convex lens, and an actuator for adjusting a distance between the two lenses in an optical axis direction. The distance between the concave lens and the convex lens is adjusted in response to a servo signal from a servo circuit (not shown) to correct a wavefront state of a laser light beam. In this embodiment, as described later, the objective lens 106 is designed so as to become a finite system for only the laser light beam for CD. Therefore, it is necessary to adequately correct a wavefront state of the laser light beam for CD to the objective lens 106. When the laser light beam for CD is used, the beam expander 104 provides wavefront correction action to the laser light beam for CD such that the wavefront state of the laser light beam becomes an adequate state.

The λ/4 plate 105 converts the laser light beam which is converted into parallel light by the collimator lens 103 (linearly polarized light beam) into a circularly polarized light beam. In addition, the λ/4 plate 105 converts the laser light beam reflected on the disc 100 (circularly polarized light beam) into a linearly polarized light beam having a polarization direction orthogonal to that of the laser light beam traveling to the disc. Therefore, the laser light beam reflected on the disc is substantially totally reflected by the polarization BS 102.

The objective lens 106 converges each of the laser light beams having the respective wavelengths on a recording layer of the disc. The objective lens 106 is designed so as to become a finite system for the laser light beam for CD and become an infinite system for each of the laser light beam for DVD and the laser light beam for next-generation DVD. In addition, the objective lens 106 is designed so as to converge the laser light beam for CD up to a predetermined numerical aperture and prevent the laser light beam for CD from converging to a point at a numerical aperture which exceeds the predetermined numerical aperture. A board thickness of a CD (1.2 mm) is larger than a board thickness of each of the other discs (0.6 mm), so it is necessary to reduce a numerical aperture of the objective lens 106 for the laser light beam for CD as compared with a numerical aperture thereof for each of the other laser light beams. Therefore, as described above, the objective lens 106 is designed so as to converge only the laser light beam for CD up to the predetermined numerical aperture.

The objective lens 106 is driven in a focusing direction, a tracking direction, and a tilt direction by an objective lens actuator (not shown in FIG. 1). That is, the objective lens 106 is driven in the focusing direction, the tracking direction, and the tilt direction in response to servo signals (tracking servo signal, focus servo signal, and tilt servo signal) from a servo circuit. A structure of the objective lens actuator will be described later.

The cylinder lens 107 provides astigmatic action to each of the laser light beams having the respective wavelengths. The cylinder lens 107 is formed by bonding a plurality of lenses whose Abbe numbers and curvatures (spherical surfaces) are adjusted such that an achromatic effect can be realized for each of the laser light beams having the respective wavelengths.

The optical axis correcting element 108 is composed of a diffraction grating and aligns the optical axis of the laser light beam for DVD with the optical axis of the laser light beam for next-generation DVD on the photo detector 109. A structure of the optical axis correcting element 108 and an operation thereof will be described in detail later.

The photo detector 109 has sensor patterns for deriving a reproduction RF signal, a focus error signal, a tracking error signal, and a tilt error signal from an intensity distribution of a received laser light beam. A signal from each of the sensors is outputted to a reproduction circuit and the servo circuit which are provided on the disc apparatus side. In this embodiment, an astigmatic method is employed as a method of generating the focus error signal and a differential phase detection (DPD) method is employed as a method of generating the tracking error signal. The sensor patterns of the photo detector 109 and the generation of the error signals will be described in detail later.

Figure 2A:
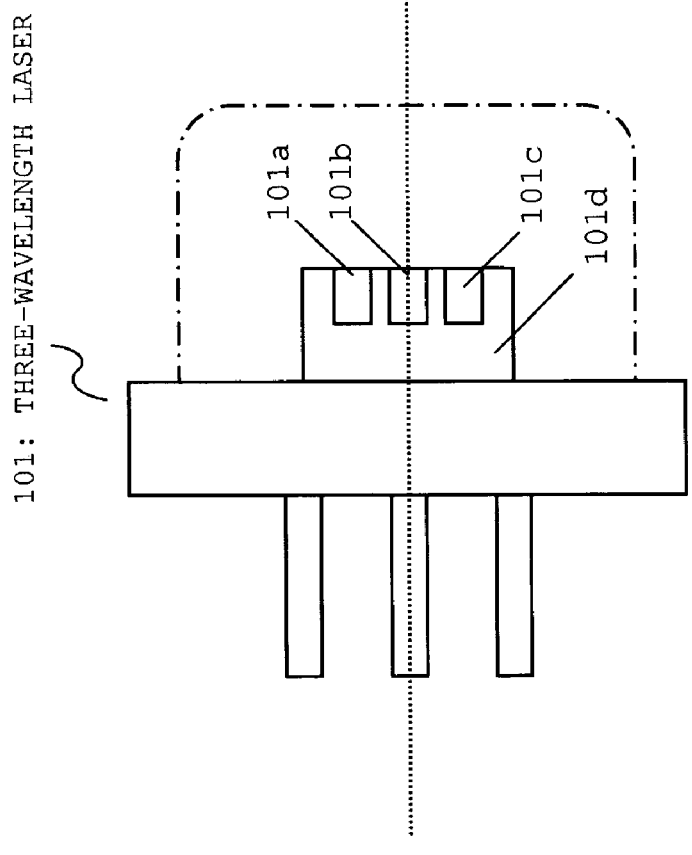

FIGS. 2A and 2B show a structure of the three-wavelength laser 101. FIG. 2B is a right side view when FIG. 2A is viewed from the right side.

In FIGS. 2A and 2B, reference symbols 101a to 101c denote laser elements. As shown in FIGS. 2A and 2B, the laser elements 101a to 101c are mounted on a base 101d to linearly arrange the laser elements as viewed from the beam window side. An interval between the respective laser elements is set to an interval in which the laser light beam (650 nm in wavelength) emitted from the laser element 101c is diffracted by the optical axis correcting element 108 such that the optical axis thereof is aligned with the optical axis of the laser light beam (wavelength: 405 nm) emitted from the laser element 101b.

Figure 3A:
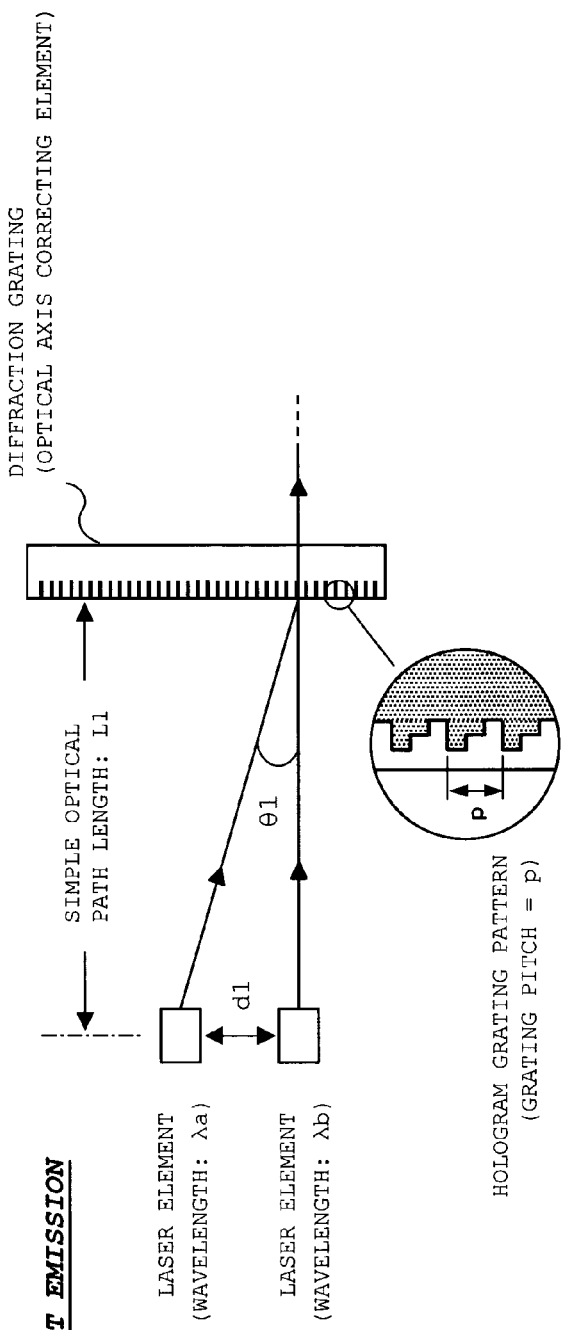
FIGS. 3A and 3B are explanatory views showing an operation of an optical axis correcting element in the embodiment of the present invention.
Figure 3B:
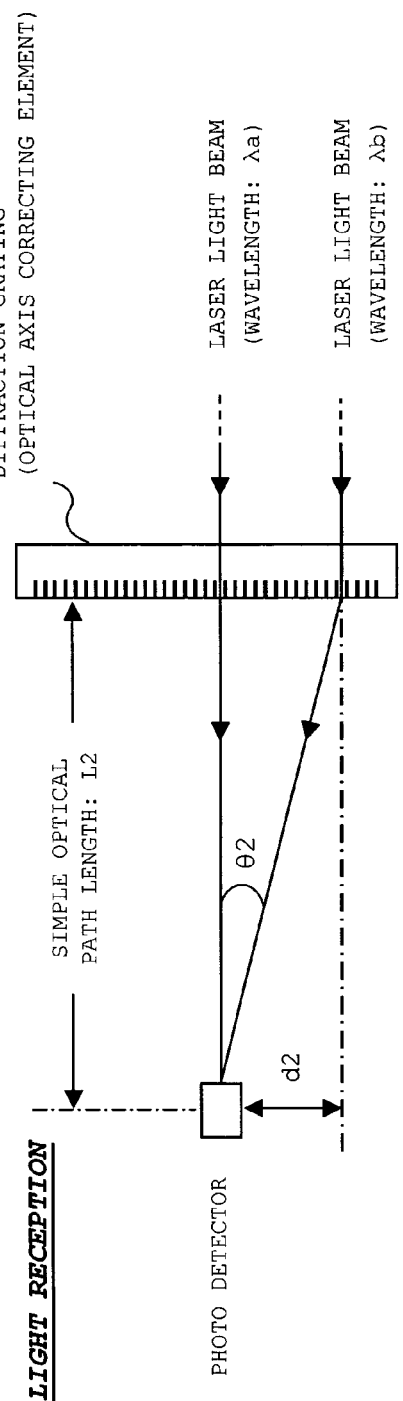

Next, the optical axis correction action made by the diffraction grating (optical axis correcting element) will be described with reference to FIGS. 3A and 3B. FIG. 3A shows the case where the diffraction grating is disposed immediately in front of the laser elements. FIG. 3B shows the case where the diffraction grating is disposed immediately in front of the photo detector.

First, referring to FIG. 3A, a hologram grating pattern is formed on the surface on the laser light beam incident side of the optical axis correcting element. In FIG. 3A, a grating pattern in which the number of steps is three is formed. When a grating pitch is given by p, a relationship between a diffraction angle θ of first order light of a laser light beam and a wavelength λ thereof is expressed by the following expressions:

$$\lambda = p \sin \theta \quad (1)$$

$$\theta = \sin^{-1} \lambda/p \quad (2)$$

Therefore, when an optical axis of the laser light beam having the wavelength λa is to be aligned with an optical axis having the wavelength λb by the diffracting action of the optical axis correcting element, light emitting point gap d1 between the laser elements is expressed by the following expression:

$$d1 = L1 \tan \theta 1 \quad (3)$$

Thus, the light emitting point gap d1 is set as follows based on the wavelength λa and the grating pitch p of the optical axis correcting element 103:

$$d1 = L1 \tan(\sin^{-1} \lambda a/p) \quad (4)$$

Therefore, a simple optical path length L1 is obtained from the wavelength λa of the emitted laser light beam and the light emitting point gap d1. The optical axis correcting element is disposed in a position corresponding to the simple optical path length. Thus, the optical axis of the laser light beam having the wavelength λa (first-order diffraction light) can be aligned with the optical axis of the laser light beam having the wavelength λb. When the light emitting point gap d1 and the simple optical path length L1 are determined, the grating pitch p of the diffraction grating may be set based on the expression (4).

As shown in FIG. 3B, when the optical axes of two laser light beams are to be aligned with each other on the photo detector, the expression (4) is modified to the following expression.

$$d2 = L2 \tan(\sin^{-1} \lambda b/p) \quad (5)$$

Therefore, the grating pitch p of the diffraction grating may be calculated from an optical axis interval d2 and a simple optical path length L2 using this expression and the diffraction grating having the grating pitch p may be disposed at a distance corresponding to the simple optical path length L2 from the photo detector.

In the optical system shown in FIG. 1, the optical axis of the laser light beam for DVD (650 nm in wavelength) is aligned with the optical axis of the laser light beam for next-generation DVD (405 nm in wavelength) on the photo detector 109. In this case, the diffraction grating (optical axis correcting element 108) is designed based on the expression (5) and disposed at a distance corresponding to the simple optical path length L2 from the photo detector 109.

Figures 4A, 4B, 4C:
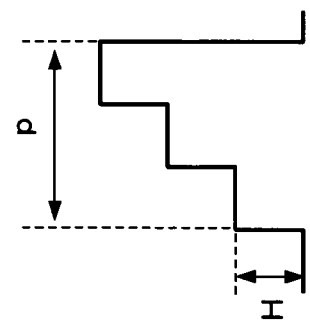
FIGS. 4A, 4B, and 4C show an example of a grating pattern of the optical axis correcting element, an example of diffraction efficiency thereof, and an example of design values thereof in the embodiment of the present invention.

FIGS. 4A to 4C show a design example of a grating pattern and a result obtained by simulation of diffraction efficiency. When a grating pattern in which the number of steps is four is formed as shown in FIG. 4A and a design condition of the grating pattern is provided as shown in FIG. 4C, diffraction efficiencies at respective wavelengths can be set to values as shown in FIG. 4B. That is, the diffraction efficiency of first-order diffraction light of the laser light beam for DVD (650 nm in wavelength), which is subjected to optical axis correction can be set to 80%. The diffraction efficiency of zero-order diffraction light of the laser light beam for next-generation DVD (405 nm in wavelength) can be set to 96%. The diffraction efficiency of zero-order diffraction light of the laser light beam for CD (780 nm in wavelength) can be set to 98%.

In this embodiment, the optical axis of the laser light beam for DVD (650 nm in wavelength) is aligned with the optical axis of the laser light beam for next-generation DVD (wavelength: 405 nm) by the optical axis correcting element 108 and then the laser light beam for DVD is incident on the photo detector 109. The optical path of each of these laser light beams is deviated from the optical axis of the laser light beam for CD (wavelength: 780 nm) over the entire optical path. Note that the optical axis of the laser light beam for CD is aligned with optical elements (polarization BS 102 to optical axis correcting element 108) of optical system. Therefore, the laser light beam for DVD and the laser light beam for next-generation DVD are incident on the optical elements while the optical axes of the laser light beams are deviated by a deviation from the optical axis of the laser light beam for CD. As a result, the optical properties of the laser light beams on the disc are deteriorated by the influence of, for example, comatic aberration or spherical aberration. However, the laser light beams are incident on the objective lens 106 as infinite system light beams, so the deterioration of the optical properties can be suppressed by tilt driving of an actuator for tilting the objective lens 106.

A sensor pattern for receiving the laser light beam for CD and a sensor pattern for receiving the laser light beam for DVD and the laser light beam for next-generation DVD are provided in the photo detector 109. The RF signal, the tracking error signal, and the focus error signal are generated based on signals from the respective sensor patterns. In the tilt servo, for example, tilt servo positions for the objective lens in which the RF signal becomes maximum in a plurality of sample positions in a disc diameter direction are obtained in advance before recording and reproduction. During the recording and reproduction, for example, servo control is performed so as to drive the objective lens to a tilt servo position corresponding to a sample position closest to a recording and reproduction position.

Figure 5:
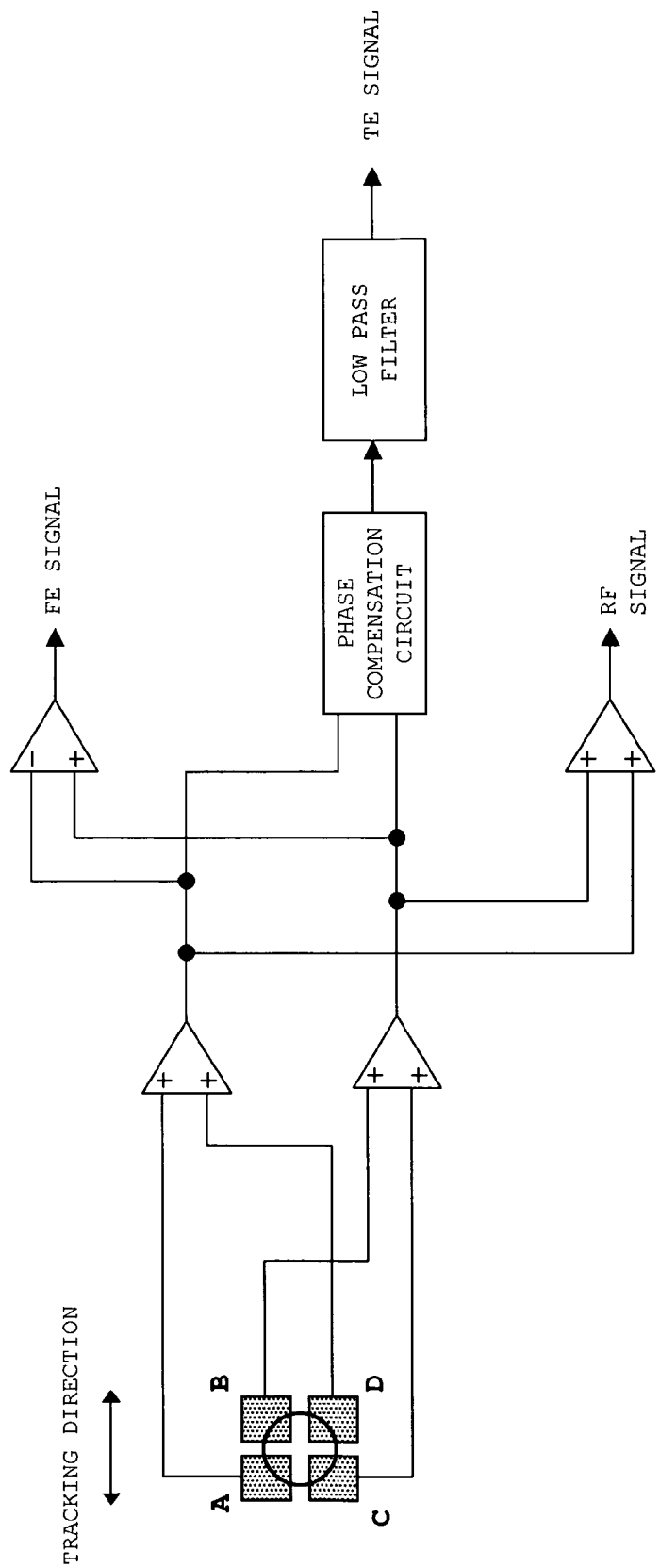
FIG. 5 is a structural diagram showing an example of a sensor pattern and an example of a signal generating circuit in the embodiment of the present invention.

FIG. 5 is a structural diagram showing a sensor pattern and a signal generating circuit therefor. The structure shown in FIG. 5 is used for the case where the focus error signal is generated by an astigmatic method and the tracking error signal is generated by the DPD method. FIG. 5 shows one of the sensor pattern for receiving the laser light beam for CD and the sensor pattern for receiving the laser light beam for DVD and the laser light beam for next-generation DVD and the signal generating circuit for the one sensor pattern. Any sensor pattern and a corresponding signal generating circuit can be constructed as shown in FIG. 5.

Figure 6:
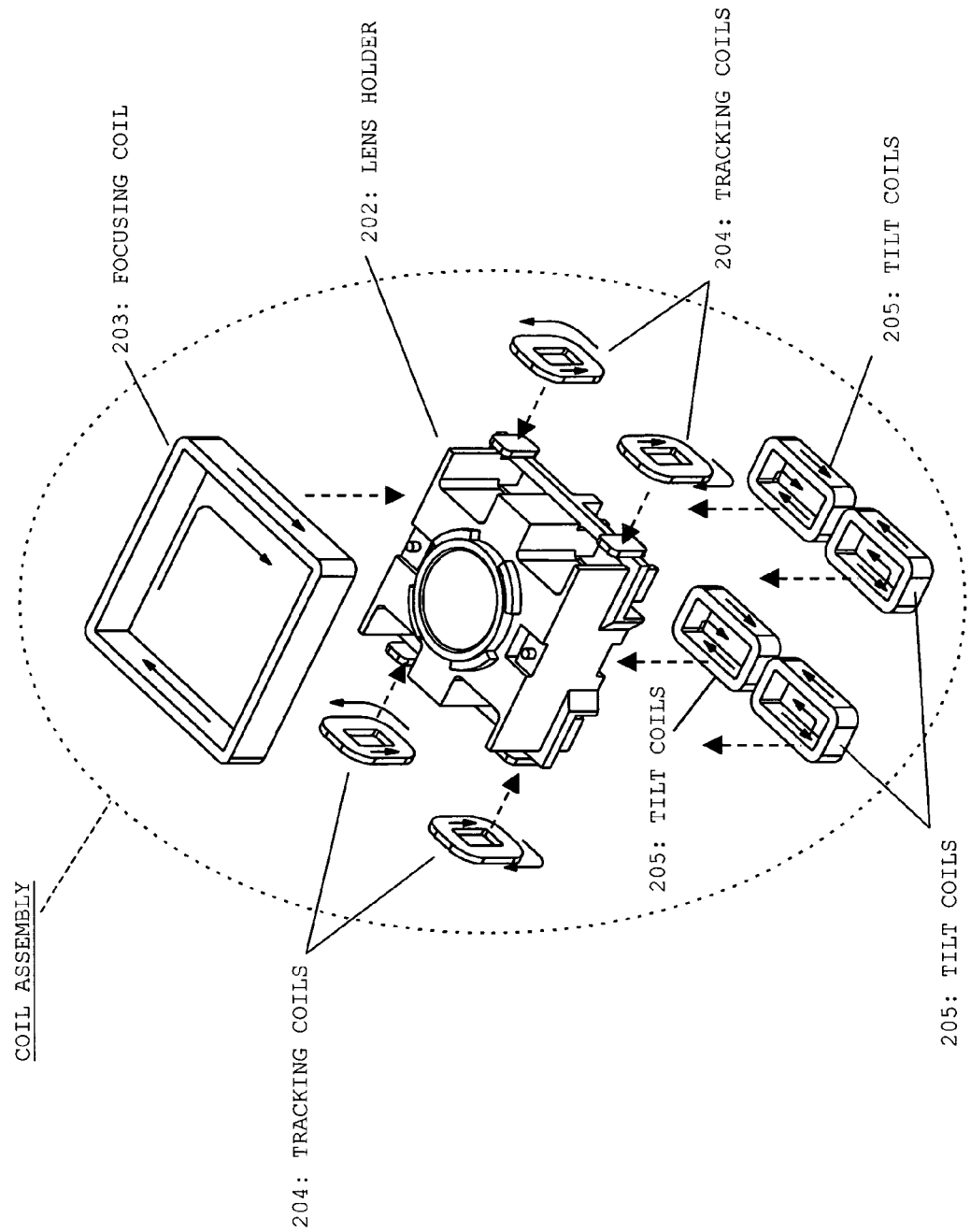
FIG. 6 is an exploded perspective view showing a main part of an objective lens actuator in the embodiment of the present invention.
Figure 7:
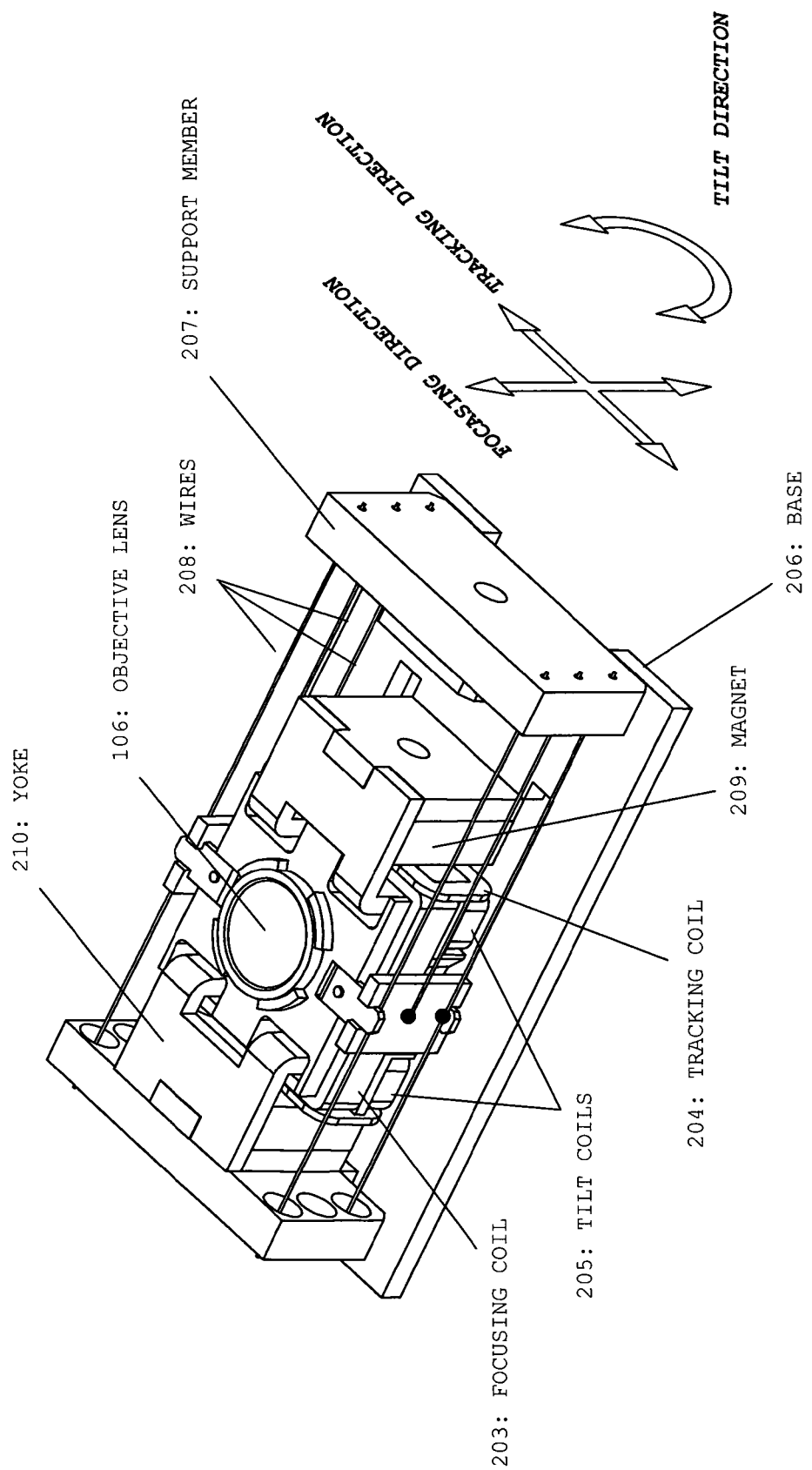
FIG. 7 is an assembled perspective view showing the objective lens actuator in the embodiment of the present invention.

FIGS. 6 and 7 are structural views showing an example of the objective lens actuator.

As shown in FIG. 6, a coil assembly includes a lens holder 202, a focusing coil 203, four tracking coils 204, and four tilt coils 205. In FIG. 6, a solid line arrow provided for each of the coils indicates a winding direction of each of the coils.

The focusing coil 203 to be wound is formed in the same peripheral shape as that of the lens holder 202 such that an inner frame of the focusing coil becomes slightly larger than a periphery of the lens holder 202, and then solidified by a resin. After that, the focusing coil 203 is inserted to the lens holder 202 from above and bonded thereto by a bonding agent.

Each of the tracking coils 204 to be wound is formed in the same peripheral shape as that of each of the protruding portions such that an inner frame of each of the tracking coils becomes slightly larger than a periphery of each of protruding portions formed in the periphery of the lens holder 202, and then solidified by a resin. After that, the tracking coils 204 are inserted to the protruding portions from side and bonded thereto by a bonding agent.

Each of the tilt coils 205 to be wound is formed in a size in which an inner frame of each of the tilt coils is in contact with each of a set of claw portions formed on a rear surface side of the lens holder 202, and then solidified by a resin. After that, the tilt coils 205 are inserted to the claw portions from below and bonded thereto by a bonding agent.

FIG. 7 is a schematic perspective view showing the objective lens actuator.

As shown in FIG. 7, the lens holder 202 to which the respective coils are attached as described above is suspended between support members 207 provided on a base 206 through wires 208 such that the respective coils are inserted to a magnetic gap between a magnet 209 and a yoke 210.

Note that the wires 208 are electrically connected to corresponding coils and servo signals are supplied to the respective coils through the wires. When bias values of the servo signals flowing through the respective coils are adjusted, it is possible to change the amount of displacement of the objective lens 106 in each of a focusing direction, a tracking direction, and a tilt direction. When the directions of the servo signals flowing through the respective coils are adjusted (reversed), a driving direction of the objective lens 106 can be reversed as appropriate.

According to this embodiment, the optical axis of the laser light beam for CD, which is incident on the objective lens 106 as the finite system light beam, is aligned with that of the optical system. Therefore, the large deterioration of the optical properties of the laser light beam for CD, which cannot be sufficiently compensated even if the objective lens 106 is tilted, does not occur, with the result that a recording and reproducing operation using the laser light beam for CD can be stabilized. At this time, although the optical axis of the laser light beam for DVD and the optical axis of the laser light beam for next-generation DVD are deviated from the optical axis of the optical system, the laser light beams are incident on the objective lens 106 as infinite system light beams, so the deterioration of the optical properties of each of the laser light beams due to the deviation can be suppressed by tilting the objective lens as described above. Thus, according to this embodiment, it is possible to realize a stable recording and reproducing operation even when the laser light beam of any wavelength is used.

In addition, according to this embodiment, the optical axis correcting element (diffraction grating) is not interposed between the three-wavelength laser 101 and the objective lens 106, so there is no case where the power of each of the laser light beams is attenuated by the diffraction grating (diffraction efficiency). Therefore, a high-power laser light beam can be guided onto the disc. When the optical axis correcting element 108 is disposed, the optical axis of the laser light beam for DVD and the optical axis of the laser light beam for next-generation DVD are aligned with each other on the photo detector 109, so the sensor pattern for the laser light beams can be commonly used. Thus, the structure of the photo detector 109 can be simplified.

The present invention is not limited to the above-mentioned embodiments and thus various other modifications can be made.

For example, as shown in FIG. 8, the laser element for emitting the laser light beam for DVD and the laser element for emitting the laser light beam for next-generation DVD may be disposed so as to sandwich the laser element for emitting the laser light beam for CD and the optical axis of the laser light beam for DVD may be aligned with the optical axis of the laser light beam for CD on the light receiving side by the optical axis correcting element 108. Therefore, a positional deviation amount of the laser light beam for DVD at the objective lens 106 can be reduced as compared with the case shown in FIG. 1. Thus, the deterioration of the optical properties of the laser light beam for DVD on the disc can be further suppressed.

As shown in FIG. 9, an optical axis correcting element (diffraction grating) 110 can be disposed in front of the three-wavelength laser 101 to align the optical axis of the laser light beam for DVD with the optical axis of the laser light beam for next-generation DVD. In such a case, although the laser power is attenuated by the optical axis correcting element L10 as compared with the case shown in FIG. 1, there is an effect in which the positional deviation amount of the laser light beam for DVD at the objective lens 106 can be reduced as compared with the case shown in FIG. 1 and the deterioration of the optical properties of the laser light beam for DVD on the disc can be suppressed. Note that the optical axis correcting element 110 is designed and disposed as described with reference to FIG. 3A.

As shown in FIG. 10, the laser element for emitting the laser light beam for DVD and the laser element for emitting the laser light beam for next-generation DVD may be disposed so as to sandwich the laser element for emitting the laser light beam for CD and the optical axis correcting element 110 may be disposed in front of the three-wavelength laser 101 to align the optical axis of the laser light beam for DVD with the optical axis of the laser light beam for CD by the optical axis correcting element 110. In such a case, although the laser power is attenuated by the optical axis correcting element 110 as compared with the cases shown in FIGS. 1 and 8, the positional deviation amount of the laser light beam for DVD at the objective lens 106 can be eliminated and the optical properties of the laser light beam for DVD on the disc can be improved. In also such a case, note that the optical axis correcting element 110 is designed and disposed as described with reference to FIG. 3A.

When the tracking error signal is to be generated by a three-beam method, as shown in FIG. 11, a three-beam diffraction grating 111 can be disposed in front of the three-wavelength laser 101 and the optical axis correcting element 110 for aligning the optical axis of the laser light beam for DVD with the optical axis of the laser light beam for CD can be disposed in front of the three-beam diffraction grating 111. In this case, the optical axis correcting element 110 is designed and disposed as described with reference to FIG. 3A. The sensor patterns formed on the photo detector 109 are changed to sensor patterns formed based on the three-beam method. In addition to the astigmatic method, another method such as a beam size method can be used as the focus error signal generating method.

Figure 12A:
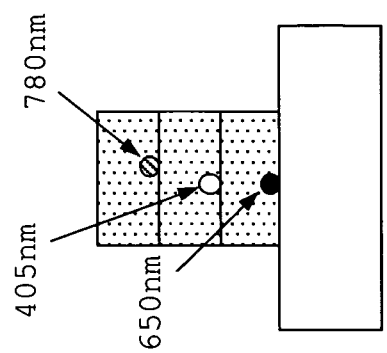
FIGS. 12A, 12B, and 12C are structural views showing other examples of the three-wavelength laser in the embodiments of the present invention.
Figure 12B:
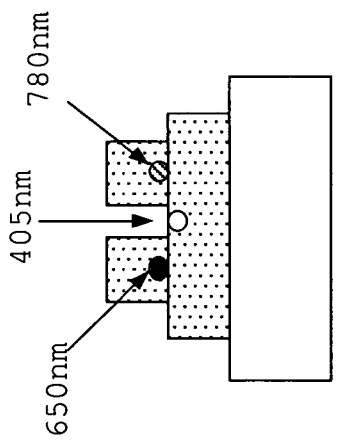
Figure 12C:
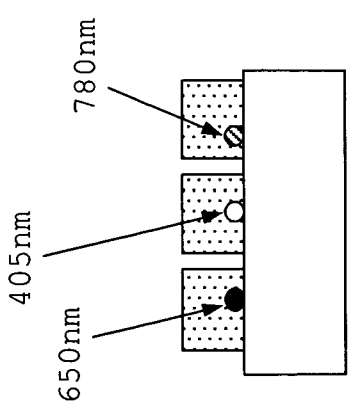
Figure 13A:
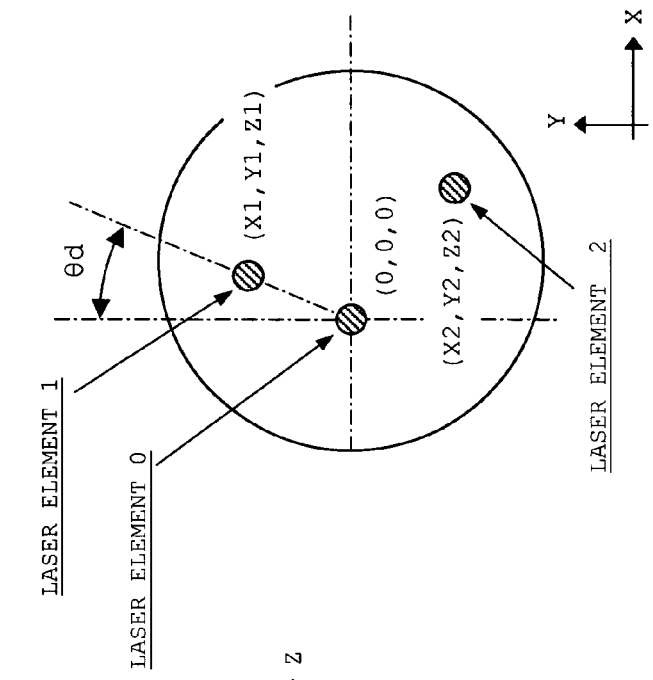
FIGS. 13A and 13B are explanatory views showing a method of calculating a simple optical path length in the embodiments of the present invention.
Figure 13B:
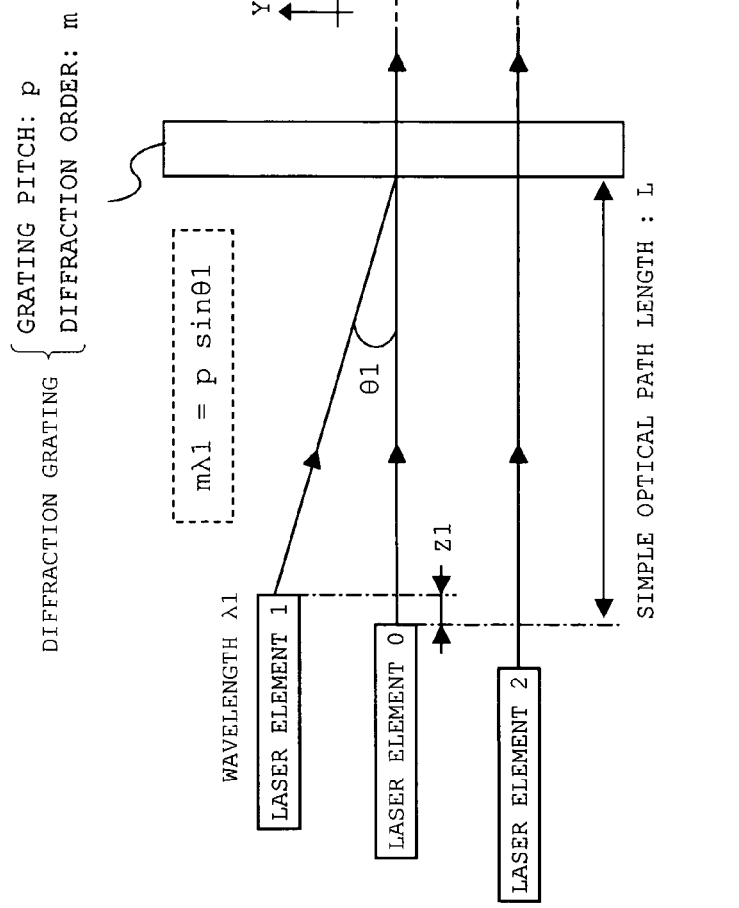

In the above-mentioned embodiments, as shown in FIG. 12A, the respective laser elements are linearly arranged. As shown in each of FIGS. 12B and 12C, it is possible to non-linearly arrange the respective laser elements. As shown in FIG. 13A, it is possible to arrange the respective laser elements in an optical axis direction. In this case, when coordinate axes are set as shown in FIG. 13B, the simple optical path length L from a laser element "0" to the diffraction grating is expressed by the following expression.

$$L = Z1 + \frac{\sqrt{X1^2 + Y1^2}}{\tan(\sin^{-1}(m\lambda/p))} \quad (6)$$

Here, when θ1 is sufficiently small, tan θ1=sin θ1 is obtained, and thus this expression is approximated by the following expression.

$$L = Z1 + \frac{\sqrt{X1^2 + Y1^2}}{m\lambda/p} \quad (7)$$

Therefore, when coordinate values (X1, Y1, Z1) of a laser element 1 and a wavelength λ1 are given as designed values of the semiconductor laser, the diffraction grating arrangement position designed as described above can be accordingly obtained by assigning values to the corresponding parameters of expression (6) or (7).

In addition to this, the positions of the optical axis correcting elements 108 and 110 to be disposed are not limited to the above-mentioned positions and thus can be changed as appropriate. For example, the optical axis correcting element can be disposed between the polarization BS 102 and the collimator lens 103. The embodiments of the present invention can be modified as appropriate without departing from the scope of technical idea described in the claims.

What is claimed is:

1. An optical pickup device, comprising:
   a semiconductor laser including three light emitting elements for emitting laser light beams having different wavelengths, which are housed in a case; and
   an optical system including an objective lens, for guiding the laser light beams emitted from the semiconductor laser onto a recording medium, wherein an optical axis of a laser light beam which is incident on the objective lens as a finite system light beam, of the laser light beams emitted from the three light emitting elements is aligned with an optical axis of the optical system.

2. An optical pickup device according to claim 1, wherein the objective lens becomes a finite system for only the laser light beam of the laser light beams emitted from the three light emitting elements and position of the semiconductor laser is adjusted relative to the optical system to align the optical axis of the laser light beam which is incident on the objective lens as the finite system light beam with the optical axis of the optical system.

3. An optical pickup device according to claim 2, wherein the light emitting elements of the semiconductor laser are housed in the case so that a first light emitting element of the light emitting elements is prevented from interposing between a second light emitting element of the light emitting elements which emits the laser light beam which is incident on the objective lens as the finite system light beam and a third light emitting element of the light emitting elements in a direction orthogonal to the optical axis of the emitted laser light beam.

4. An optical pickup device according to claim 2 or 3, further comprising a diffraction grating for aligning an optical axis of only one of two laser light beams other than the laser light beam which is incident on the objective lens as the finite system light beam with one of an optical axis of the other of the two laser light beams and the optical axis of the laser light beam which is incident on the objective lens as the finite system light beam by a diffraction action.

5. An optical pickup device, comprising:
a semiconductor laser including three light emitting elements for emitting a laser light beam for CD, a laser light beam for DVD and a laser light beam for next-generation DVD, which are housed in a case; and
an optical system including an objective lens, for guiding the laser light beams emitted from the semiconductor laser onto a recording medium,
wherein an optical axis of a laser light beam which is incident on the objective lens as a finite system light beam, of the laser light beams emitted from the three light emitting elements is aligned with an optical axis of the optical system.

6. An optical pickup device according to claim 5, wherein the objective lens becomes a finite system for only the laser light beam of the laser light beams emitted from the three light emitting elements and position of the semiconductor laser is adjusted relative to the optical system to align the optical axis of the laser light beam which is incident on the objective lens as the finite system light beam with the optical axis of the optical system.

7. An optical pickup device according to claim 6, wherein the light emitting elements of the semiconductor laser are housed in the case so that a first light emitting element of the light emitting elements is prevented from interposing between a second light emitting element of the light emitting elements which emits the laser light beam which is incident on the objective lens as the finite system light beam and a third light emitting element of the light emitting elements in a direction orthogonal to the optical axis of the emitted laser light beam.

8. An optical pickup device according to claim 6 or 7, further comprising a diffraction grating for aligning an optical axis of only one of two laser light beams other than the laser light beam which is incident on the objective lens as the finite system light beam with one of an optical axis of the other of the two laser light beams and the optical axis of the laser light beam which is incident on the objective lens as the finite system light beam by a diffraction action.

9. An optical pickup device according to claim 5, wherein the objective lens becomes a finite system for only the laser light beam for CD, of the laser light beams emitted from the three light emitting elements and position of the semiconductor laser is adjusted relative to the optical system to align the optical axis of the laser light beam for CD with the optical axis of the optical system.

10. An optical pickup device according to claim 9, wherein the light emitting elements of the semiconductor laser are housed in the case so that a first light emitting element of the light emitting elements is prevented from interposing between a second light emitting element of the light emitting elements which emits the laser light beam for CD and a third light emitting element of the light emitting elements in a direction orthogonal to the optical axis of the emitted laser light beam.

11. An optical pickup device according to claim 9 or 10, further comprising a diffraction grating for aligning an optical axis of only one of two laser light beams other than the laser light beam for CD with one of an optical axis of the other of the two laser light beams and the optical axis of the laser light beam for CD by a diffraction action.

12. An optical pickup device according to claim 9 or 10, further comprising a diffraction grating for aligning an optical axis of only the laser light beam for DVD other than the laser light beam for CD with one of an optical axis of the laser light beam for new-generation DVD and the optical axis of the laser light beam for CD by a diffraction action.

* * * * *